United States Patent [19]

Sutcliffe et al.

[11] Patent Number: 5,074,037

[45] Date of Patent: Dec. 24, 1991

[54] PROCESS FOR PRODUCING ELECTRICAL CONNECTIONS ON A UNIVERSAL SUBSTRATE

[75] Inventors: Emile Sutcliffe, Baden, Great Britain; Jörgen Arnesson, Opfikon, Sweden; Christian Bay, Zürich, Switzerland

[73] Assignee: Oerlikon-Contraves AG, Zurich, Switzerland

[21] Appl. No.: 469,026

[22] Filed: Feb. 12, 1990

[30] Foreign Application Priority Data

Dec. 1, 1989 [CH] Switzerland ............... 4306/89

[51] Int. Cl.$^5$ ............................................. H05K 3/02
[52] U.S. Cl. ........................................ 29/847; 29/593; 174/261; 364/491
[58] Field of Search ................ 29/846, 847, 593; 364/491; 174/261, 262

[56] References Cited

U.S. PATENT DOCUMENTS

| | | | |
|---|---|---|---|
| 4,300,715 | 11/1981 | Keizer et al. | 228/180.2 |
| 4,458,297 | 7/1984 | Stopper et al. | 174/265 |
| 4,649,497 | 3/1987 | Carlson et al. | 29/846 |
| 4,734,980 | 4/1988 | Nakamura et al. | 29/830 |
| 4,805,110 | 2/1989 | Takahashi et al. | 29/741 |
| 4,831,725 | 5/1989 | Dunham et al. | 29/847 |
| 4,953,277 | 9/1990 | Crispin et al | 29/593 |

FOREIGN PATENT DOCUMENTS 0167732  5/1990  European Pat. Off. .

OTHER PUBLICATIONS

Shigeo Asahara et al., "A Routing System Based on a Single-Row Router and Its Wirability", *Circuit Theory and Applications*, vol. 9, 1981, pp. 285-296.

J. Soukup et al., "On Hierarchical Routing", *Journal of Digital Systems*, vol. V, No. 3, 1981, pp. 265-289.

M. Marek-Sadowska et al., "A New Approach To Routing of Two-Layer Printed Circuit Board", *Circuit Theory and Applications*; vol. 9, 1981, pp. 331-341.

*Primary Examiner*—P. W. Echols
*Attorney, Agent, or Firm*—Walter C. Farley

[57] ABSTRACT

The process for wiring substrates with a universal pattern of conductors and a large number of predetermined bonding/cutting localities is characterized in that from the quantity of all the possibilities for bonding and cutting is removed the quantity necessary for the realization of a given application, after realization of one given circuit this quantity is tested for further possibilities for realizing the circuit, and the found quantity of possibilities is made available as a correction quantity. The advantage of such a correction potential is that layout or contacting errors can be corrected in a second passage, so that wastage is reduced.

13 Claims, 9 Drawing Sheets

PROCESS FOR PRODUCING ELECTRICAL CONNECTIONS ON A UNIVERSAL SUBSTRATE

FIELD OF THE INVENTION

The invention is in the field of electrical circuit technology and relates to a process for realizing an electrical circuit on a universal substrate having a plurality of conductors with a plurality of connecting possibilities, as well as to an apparatus for performing the process.

BACKGROUND OF THE INVENTION

Universal substrates are used in electrical circuit technology for prototypes and small-scale production. These are "circuit boards" with a plurality of conductors and contact possibilities, which if necessary can be subsequently interconnected and contacted. In this way it is possible without any specific conductor pattern layout to have a plurality of different electronic circuits on the same board type. However, these "circuit boards" are not printed circuit boards in the conventional sense, but substrates which are very densely occupied by conductors and onto which in hybrid technology the IC's and other components are directly bonded. Generally such a substrate has a ceramic base with a conductor pattern. In the case of universal substrates at least two conductor patterns are provided in different planes in such a way that a maximum number of circuits can be realized thereon. The desired circuit is realized by contacting (bonding) conductor crossings and/or separating (cutting) conductor portions. An example of a substrate of this type is described in the Applicant's European Pat. No. 167 732.

A user is confronted with completely new problems as a result of the multiplicity of circuit possibilities of all the conductors and their bonding/cutting localities on such a universal substrate. Thus, from the large number of possibilities, it is necessary to realize a specific application, i.e. the desired circuit, by bonding and/or cutting. However, this is not all, because it is necessary to assume that corrections in the form of alternative or auxiliary conductor lines will be necessary because of circuit errors in the layout or realization phase. In order to convert this into facts an optimization process is unavoidable. In addition, during the physical performance of the wiring, i.e. the bonding and/or cutting operations, such a process must be performed as rapidly as possible through adequate machine control. This must all be carried out in a micromedium, in which the human operator cannot work without optical aids. Thus, the activity of "wiring" a substrate must be completely performed by a machine, which also forms an object of the invention.

SUMMARY OF THE INVENTION

However, the main problem is the optimum dealing with the large number of wiring possibilities, together with simultaneous realization. It is therefore an object of the invention to provide a process enabling an optimum utilization of a universal substrate both from the circuit and realization standpoints, which are closely interlinked.

Firstly a few introductory words on the process procedure in general. Universal circuit substrates used to be produced e.g. by wire-wrap technology, which makes use of such a number of circuit planes as required in order to produce the desired connections. The aim was always to produce electrical connections between two or more points without short-circuits with other conductors. Fundamentally, this has not changed with the use of universal substrates, the aim still being to produce short-circuit-free electrical connections between two or more conductors, i.e. to carry out electrical wiring, but in the present case the "wires" already exist and must be interconnected in a special way. However, the systematic disposition of predetermined bonding/cutting localities prevents the use of the hitherto known wiring methods either directly or in modified form. It is instead necessary to use a new wiring technology, which forms the subject matter of the following discussion.

Considered topologically, a universal substrate has a certain variation potential with regard to the existing and realizable connections through its predetermined bonding/cutting localities that can be changed by bonding or cutting. Before a single contact can be made, this variation potential is at a maximum. The magnitude of this variation potential is dependent on the construction plan of the substrate. A specific construction plan determines the upper limit of the variation potential (maximum). With each irreversible change at a bonding/cutting locality, there is a decrease of the variation potential which eventually reaches the lower limit of the variation potential (minimum) of zero. The quantity of all the possibilities of obtaining a given electrical circuit (an application) on a given substrate, is the application (or useful) potential, which is between the upper and lower limits of the variation potential. In the most favorable case, the application potential can extend close to the upper limit of the variation potential and in the least favorable case it is very small.

The unusable potential of the "unusable" bonding/cutting localities for the specific application is the loss potential. The variation potential as the number of circuits which can be realized contains the application potential as the quantity of usable circuits for the given application. The difference, i.e., the quantity of the unusable circuits gives the loss potential. The circuits which are usable but not required for a given application give the correction potential. The latter is a very important quantity, because it permits the subsequent correction of manufacturing and/or design errors. The correction potential is a subquantity of the application potential. However, if there are substrate defects or design errors, there is a modified variation and/or application potential and the correction potential can extend into the range of the previous loss potential.

BRIEF DESCRIPTION OF THE DRAWINGS

With reference to the following drawings information is given on how it is possible to cope with this. In drawings show.

DESCRIPTION OF THE PREFERRED EMBODIMENTS

Figure 1A:
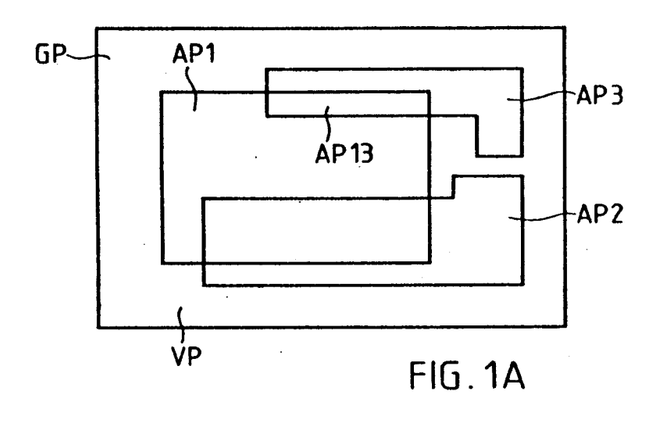
Figs. 1A and 1B are diagrams of the potential consideration in terms of set theory.

As stated hereinbefore, prior to using a universal substrate for the realization of an electric circuit, it is necessary to consider its potentials. The next stage is the association of the bonding/cutting localities. FIG. 1A shows in the form of a rectangle an area representing the quantity of the variation potential (GP) of a specific substrate, at its upper limit. This can relate to only a part of the substrate, if the application potential is to be evaluated for a specific circuit of several to be created on the same substrate. Alternatively, it relates to the complete substrate if only one circuit is to be realized on it. In this quantity representing the GP are incorporated in the form of quantities the potentials of three different applications AP1, AP2, AP3. The residual area or quantity represents the loss potential VP. It is pointed out that these potentials in each case represent the combinatorial number of possibilities for realizing circuits by bonding and/or cutting and do not represent the actual number of bonding/cutting localities physically present on the substrate.

It can be seen that Application 1 has more possibilities (AP1) to be realized on the substrate than the two other applications. Application 2 is restricted, although the same number of bonding/cutting localities exist on the substrate as for Application 1 and this is even more marked in the case of Application 3. The reasons are more connections, less favorable wiring configurations (crossing), circuit nesting, etc., which are all disadvantageous in connection with wiring on a universal substrate. It can also be gathered from the overlap of the quantities AP1, AP2 and AP3 that while application 1 can be realized with either of the two other applications on the same substrate, it cannot be realized with both of them. Applications 2 and 3 cannot be realized together. For the realization of both applications 1 and 3 on the same substrate, the application potential is AP13.

The selection of a specific circuit for a given application from the plurality of given possibilities (application potential) is done by an optimization process with weighted factors such as surface requirement, number of contacts, overlap of different applications (reciprocal influencing), line lengths, etc. An important aspect is the remaining connection potential. Each realization reduces in its way the variation potential and the application potential, because a contact realized at a bonding location renders impossible a number of other possibilities for realizing the circuit. The correction potential can also be incorporated into the optimization. However, there is only something to be corrected if a realization has proved to be faulty or erroneous. It is then to be assumed that a realized bond or cut which was not intended or is faulty cannot be reliably used or remedied and therefore must not be used. Thus, a fault will always further reduce the correction potential and, in some cases, drastically if the faulty location is a key circuit point.

Figure 1B:
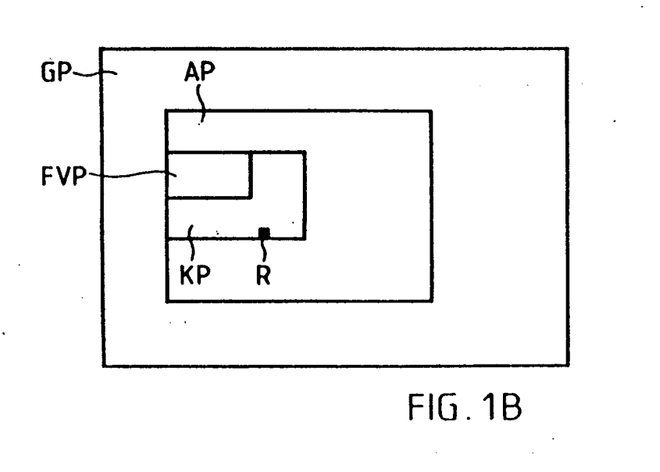

FIG. 1B pictorially shows this process by means of the quantity diagram. On the basis of a variation potential GP (upper limit) of a given universal substrate and an application with the application potential AP on the same substrate, the realization R of a specific circuit brings about a reduction of the application potential AP to the correction potential KP, which is in turn further reduced by additional, error-caused loss potential FVP. A substrate with a faulty or erroneous circuit can be returned to the process, for realization of correcting circuit parts. However, this is only possible if there is a sufficiently large correction potential.

Figure 2:
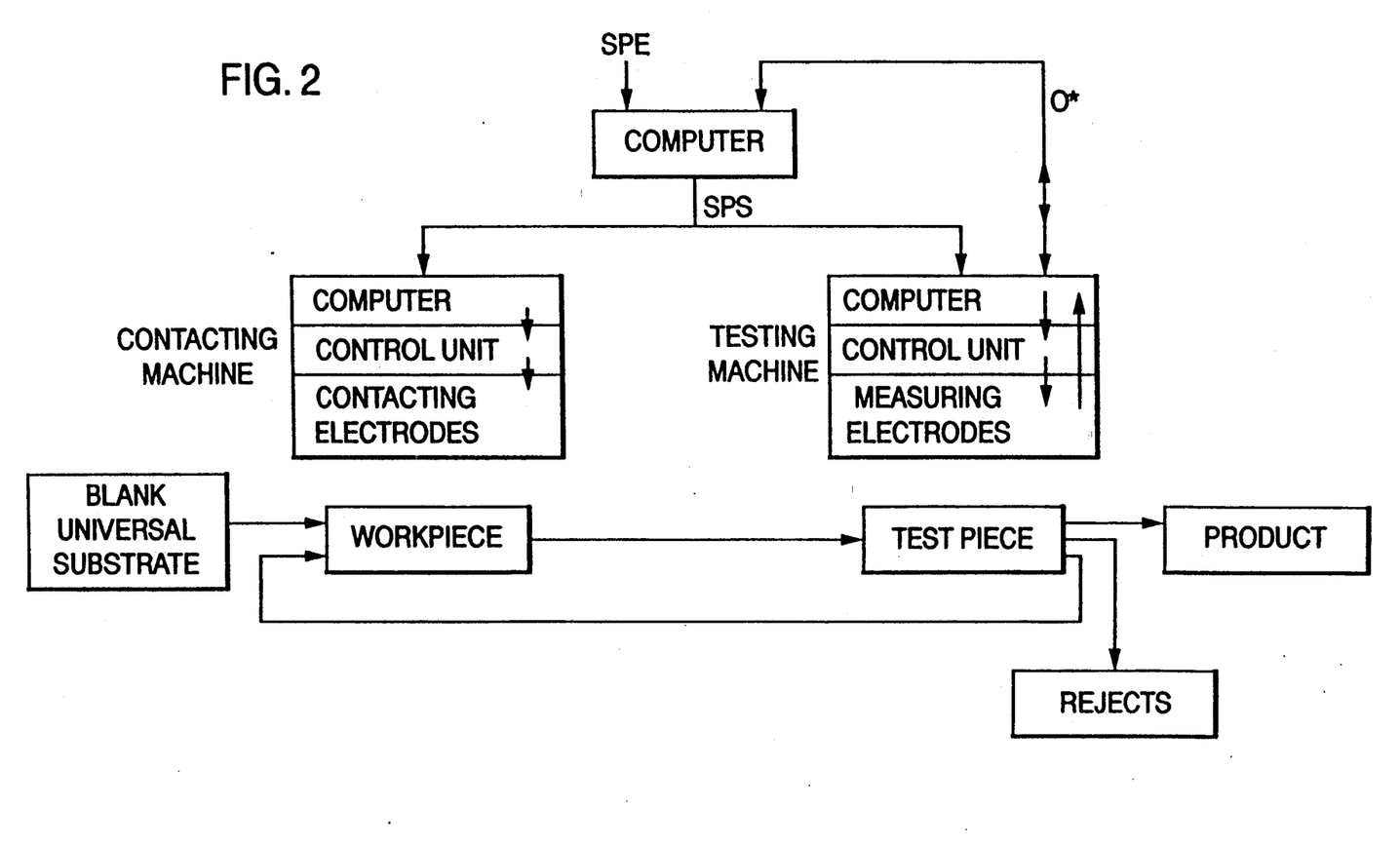
FIG. 2 is a schematic diagram of the essential steps in the process sequence for realizing a circuit on a universal substrate and simultaneously representing the essential apparatus parts of a microcontacting device.

FIG. 2 shows diagrammatically a process flow for a universal substrate which is introduced as a blank into the process on the left hand side, and on the right hand side leaves with the application realized as a customer-specific product. The blank universal substrates are prewired in a machine that bonds and/or cuts conductors. Final wiring consists of bonding on the circuit elements and is not part of the invention. In the process, the substrates are physically treated and then passed on to a testing means. In the latter the substrate is measured and checked with respect to the preset information, i.e. the wiring plan from the computer. If the preset requirements are fulfilled, the substrate is passed on as "good". If the preset requirements are not fulfilled, the correction potential is determined and related to the necessary corrections, i.e. to the electrical replacement paths. If these criteria are positively fulfilled, i.e. if there still is a possibility for electrical replacement paths, the substrate is returned and sent back into the contacting device for reprocessing. If these criteria are negatively fulfilled, i.e. there is no possibility for an electrical replacement path, then the substrate is disposed of as waste, although it still need not be completely unusable.

The real correction potential is generally only obtained when the fault is present. If the fault is detected by the testing device, e.g. an inadequately formed contact point, then the computer must establish whether, among all the remaining circuit possibilities, there is still a "path", which can functionally compensate the error point. In certain circumstances, there can be more than one path for overcoming the difficulty. If this is the case, a sufficiently high correction potential is indicated and the substrate, which is a very expensive component, is returned to the process. If there are several possibilities or paths and the correcting contacting fails again, then the substrate is introduced a third time into the contacting or wiring machine.

The contacting machine, which will be described in greater detail hereinafter, e.g. operates with a laser for cutting or welding, or with a microcontact welding device or combined with both. Apart from these two contacting procedures, this process also permits contacting by means of electrically conductive materials, e.g. adhesive between two conductors and for this purpose the apparatus must be correspondingly designed.

The contacting machine can perform contacting simultaneously or sequentially, in parallel or series, or in mixed forms. Contacting and/or cutting takes place according to the circuit diagram. A distinction is made between the circuit diagram of the electronic connections of an application, the circuit diagram for the substrate (SPS) (the actual wiring of the application on the substrate) and the "circuit diagram" for the electrode control SPK in the contacting machine. From the SPE is obtained the SPS and from the latter the SPK. The inventive process connects between the SPE topography and the SPK electrode control and, in an additional step, to the transport means for the material processed in the machine.

The procedure used for bonding and/or cutting is dependent on the substrate used. If laser welding is used for contact formation or conductor interruption, then the apparatus will best operate in a serial manner. However, acceptable process speeds can be obtained, because the laser control operates very fast. If microcontact welding is used for bonding, e.g. ultrasonic or cold welding with pressure, at least a partly parallel procedure is desired. In this case, a cutting laser is used for cutting the conductors.

Universal substrates have a regular, coordinate-related arrangement of bonding/cutting localities, so that it is possible to construct and use multi-welding heads with arrays of e.g. 10×10 welding points or 20×40 welding points. Apart from the positioning routine bringing the multi-welding heads into the desired position, there must also be a n from m selection, n being the number of contact points to be instantaneously welded and m the number of welding points of the multi-welding head used. Thus, the process speed can be considerably increased with a one-time construction expenditure for the multi-welding head.

As stated, the process generates from the SPE the SPK and contains in an additional process step an operator 0*, which connects the functions of the contacting machine and the testing station. Operator 0* links the test results with the wiring details and establishes the correction potential or at least assists in this. It establishes the reoptimization for a compensation path after a fault has been found and determines any residual correction potential. Thus, this operator 0* is also competent for the reoptimization for the realization of a circuit on an already processed universal substrate. It operates in the processing operation in such a way that in the case of a single substrate passage there is no reoptimization, i.e. the correction potential is not used, and in the case of a multi-passage there is a real reoptimization and therefore the correction potential is used. Operator 0* always flanks the process with respect to the malfunctions. However, it is not necessary that for each individual substrate, whether faulty or not, the correction potential is determined. The calculation provided for this purpose is only initiated if the predetermined SPS and the tested (realized) SPS do not coincide.

Finally, if the correction potential is exhausted, the substrate is rejected as waste, or is supplied recursively or iteratively to another application. On such a substrate it might still be possible to realize a circuit because, as stated, considerable differences can exist between the application potentials of different applications. It is a further advantage of the described process, that offline applications can be sought, which can still be realized on such a substrate, which merely has been rejected for one application and therefore has a reduced limiting potential. In certain circumstances, this is even possible with a desired correction potential.

If a substrate is rejected because of a faulty circuit and no more correction potential, it is possible using the determined and existing data to seek offline for further applications, which can still be realized on the "residual substrate". This additionally reduces losses, which is important in view of the high cost of substrates.

The diagrammatic representation of FIG. 2 shows separate devices for optimization, contacting (wiring) and testing. These are, on the one hand, the essential steps in the process sequence and on the other hand the essential parts of the apparatus for microcontacting. Obviously these functions can be partly or entirely combined. Thus, for example, the three calculating or computing parts can be combined into a central computer, whose output or outputs, among other things, supply the control signals for the control part of the contacting electrodes and for the control parts of the measuring electrodes of the testing machine. It is possible for the same head part (e.g. a slide) to carry both the contacting and the measuring electrodes, i.e., for the contacting and testing machine to have a common coordinate control. The contacting of a substrate or workpiece and the testing of another substrate (e.g. the preceding substrate), which is now a testpiece, can take place simultaneously jointly covering the SPK and SPP ("circuit diagram" for the test control). In the case of contacting by cold welding, i.e. with pressure on the contacting electrodes, these electrodes can optionally be used as test electrodes also. Thus, the contacting machine and testing machine would be substantially identical, but from the process sequence standpoint, the process shown in FIG. 2 generally applies to all conceivable cases.

In summary form the procedure is essentially as follows:
- compute from the given data of the application (SPE) and the substrate the optimum wiring the minimum number of contacting (SPS) operations, using the minimum conductor lengths etc. (computer),
- compute control (SPK) of microcontacting tool and control (SPP) of testing tool (computer),
- position the electrodes (control),
- carry out welding (bonding) and/or separation (cutting) (physically),
- carry out testing process (measuring and calculating),
- decide on good, rejection, return (computer),
- return for correction (physical),
- compute reoptimization of wiring (computer),
- compute electrode control for correction and test (computer),
- position electrodes (control),
- carry out welding and/or separation for correction wiring (physical),
- carry out retesting process (measuring and calculating),
- decide on good, rejection, return, etc.

Figure 3A:
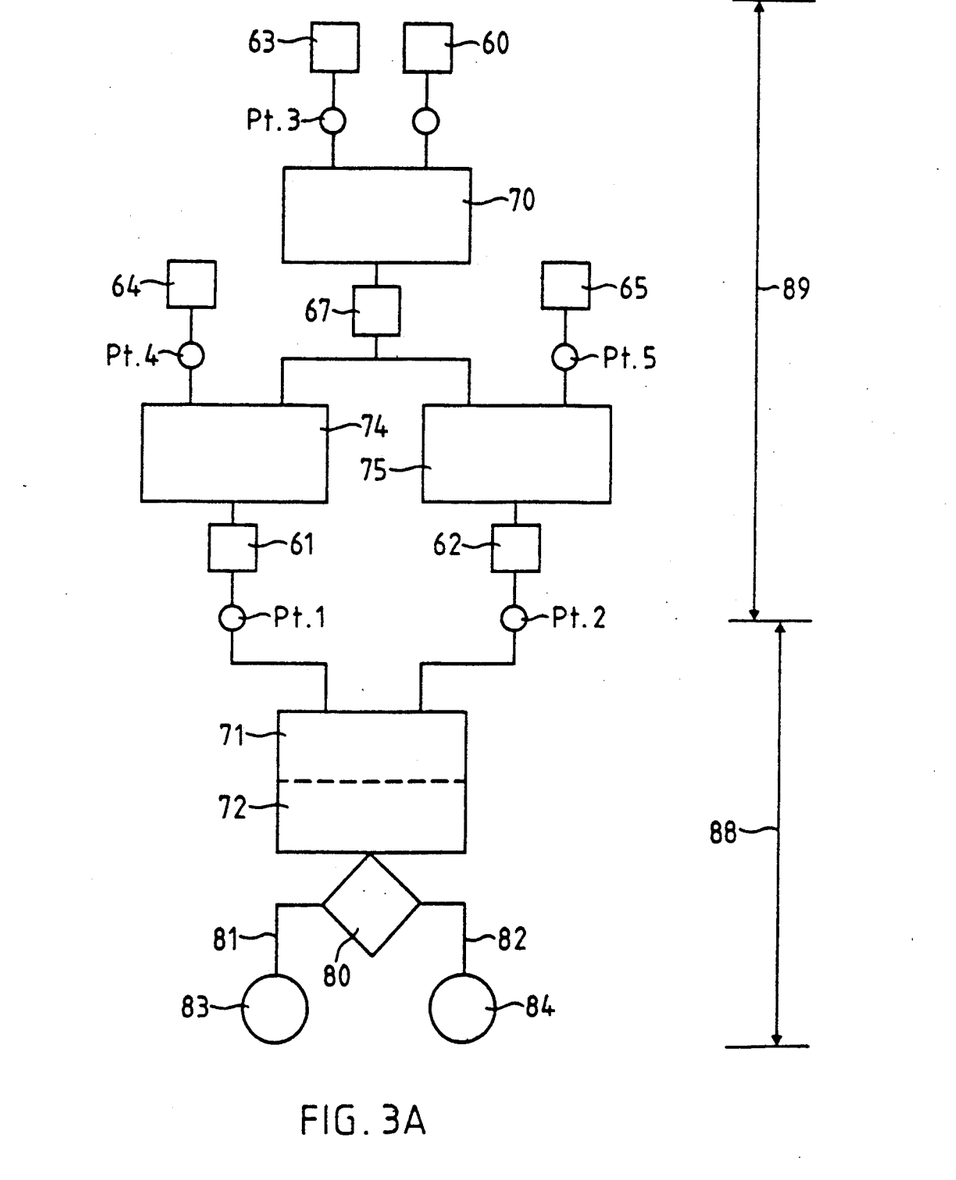
FIGS. 3A, 3B, and 3C are flow charts showing examples of three possible process embodiments in accordance with the invention.
Figure 3B:
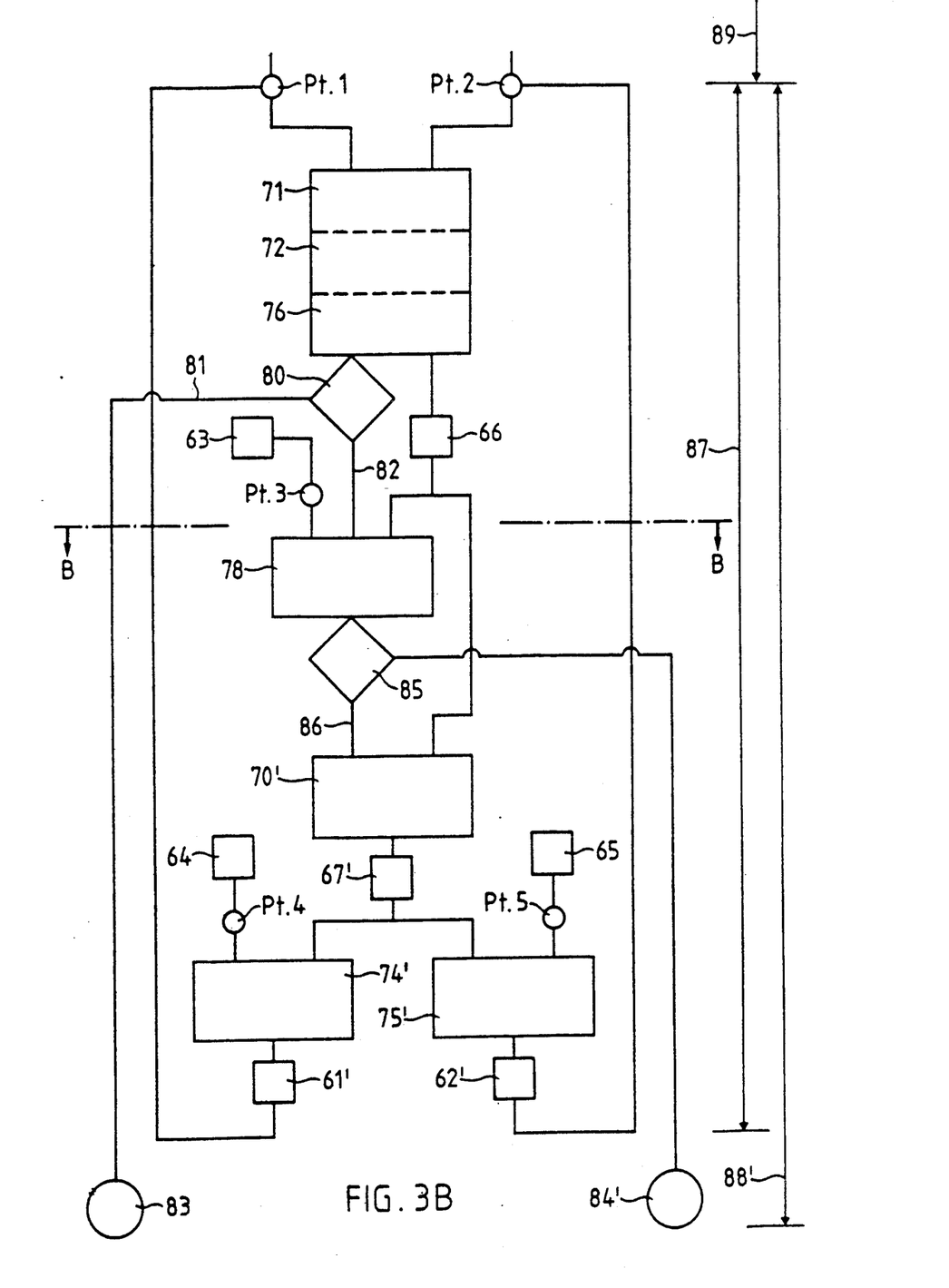
Figure 3C:
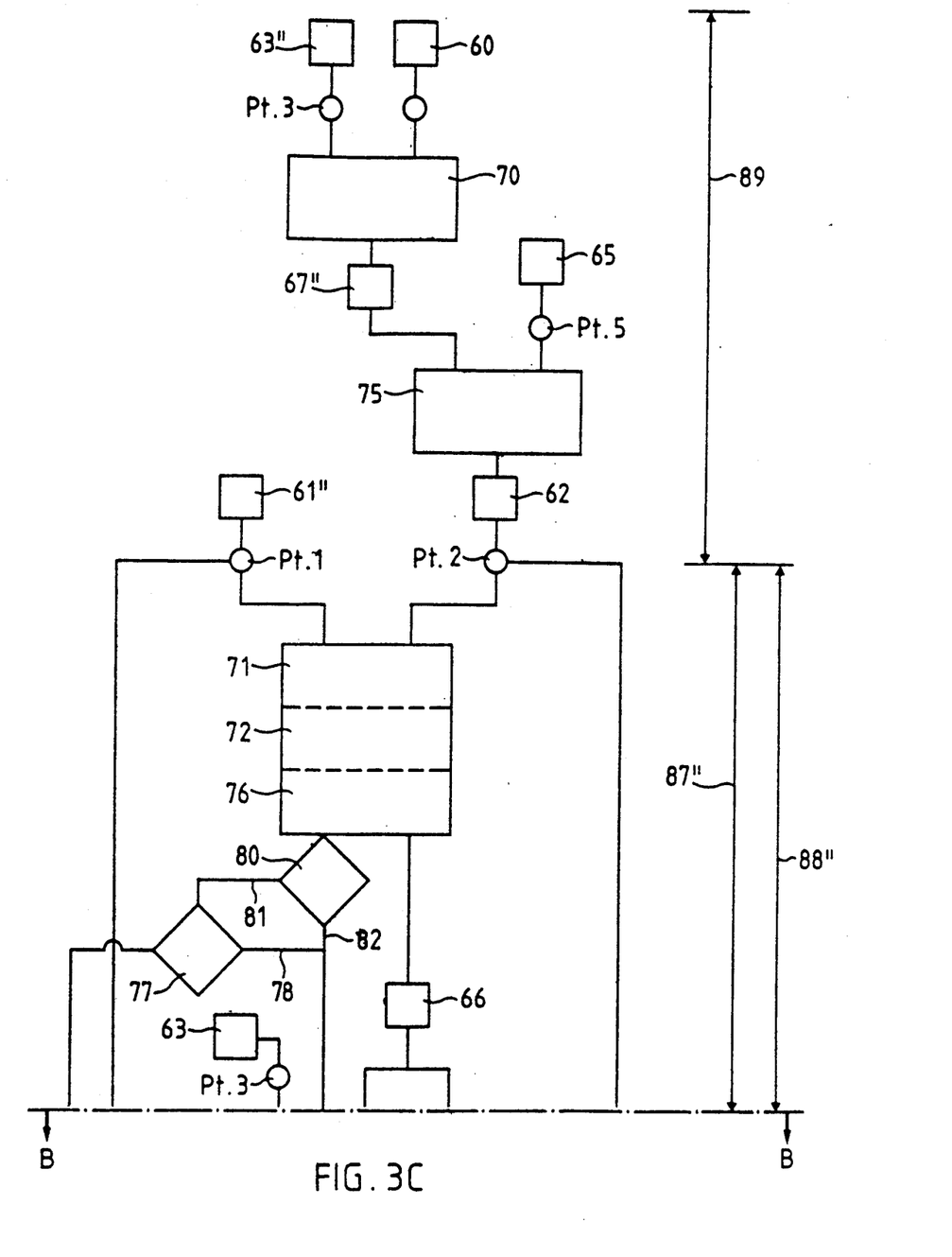

FIGS. 3A, 3B and 3C show the process sequence in greater detail. FIG. 3A shows the sequence without substrate return in the case of faulty wiring. In a first step the optimum connection design 70 is calculated from data 63 of the electric circuit diagram (Pt. 3), data 60 of the universal substrate and predetermined optimization criteria such as e.g. minimum of bonding or cutting operations, minimum length of conductors.

Figure 9:
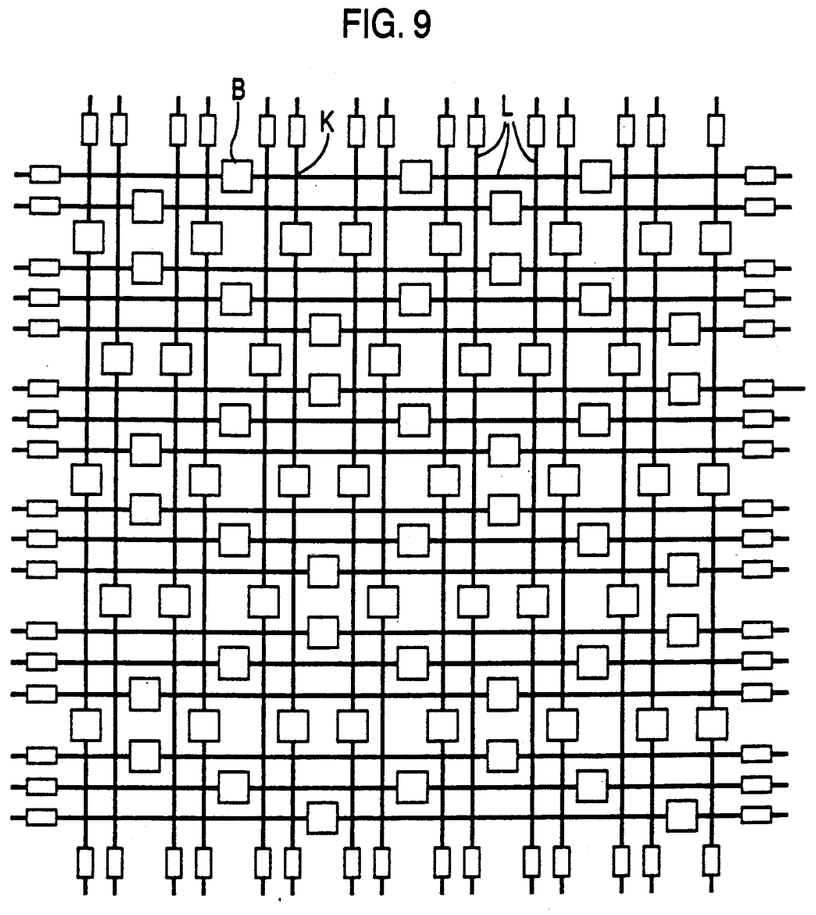
FIG. 9 is an exemplary line pattern of a universal substrate, as used for the contacting process according to the invention.
Figure 10:
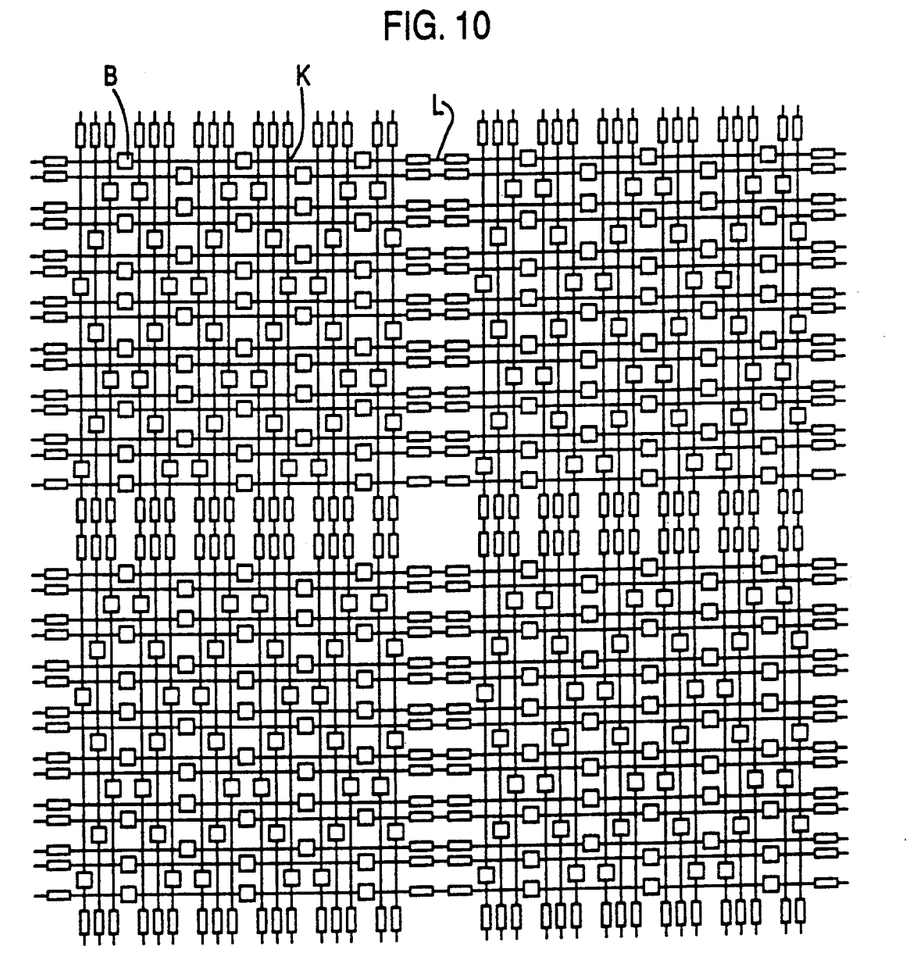
FIG. 10 is the line pattern according to FIG. 9 in modular form to show that the process can be used on line patterns of random size within the substrate dimensions.

The use of a CAD system is recommended for the connection design. In connection with such systems there are manual routers (disentanglement by hand) and autorouters (automatic disentanglement). Routers are calculation programs for the design of printed circuit boards. These programs are based on the idea that the plane on which the conductors L are to be applied is completely free and conductors can pass in any direction. For planning an optimum connection design a previous optimum planning of the position of the components is presupposed, taking account of the minimum surface, minimum connections, short connection paths and optimum thermal heat dissipation. For optimum connection of the components via crossed contact points K, on a universal substrate, as discussed, there is a degree of freedom such that when placing components it is not yet necessary to decide to which bonding surfaces B of the substrate they have to be bonded (FIGS. 9 and 10). It is merely necessary to respect the condition "no crossing of bonding wires" and "bonding wire shorter than 3 mm". On this task, the router requires a corresponding addition, because in the discussed example only right-angled direction changes are appropriate. For those conductors of the basic pattern which are not used, a "travel interdiction" must be imposed on the autorouter. These are certain important specific boundary conditions for the autorouter to be used (e.g. based on the Bartels Router, Lee Router, etc. with the corresponding addition). Then the number of separations must be minimized for maximizing the correction potential.

The data 67 of the application-specific substrate plan (SPS), i.e. the wiring data, are supplied to a calculation process 74 for determining the optimum containing process, which also requires data 64 of contacting means (Pt. 4). The wiring data (SPS) are also supplied to a further calculation process 75 for fixing the testing process, also requiring the data 65 of the testing device (Pt. 5). From the two calculation processes result the control data 61 (SPK) for the contacting device (Pt. 1) and the control data 62 (SPP) for the testing device (Pt. 2). Computing SPS, SPK and SPP constitutes an initialization 89 which is specific for apparatus, substrate and application and is carried out only once for a given application.

Then contacting 71 of the unwired substrate in the contacting device and testing 72 of the wired substrate in the testing device follow. For testing, the substrate is measured and tested for preset information, i.e., the wiring plan (SPS) 80. If the preset information is fulfilled 81, then the substrate is passed on 83 as usable. If the preset information is not fulfilled 82 and no return is planned, then the substrate becomes waste 84. This phase 88 is repeated for each new substrate to be contacted for the same application.

FIG. 3B shows the process sequence with a return in the case of unfulfilled preset data. Following an identical initialization 89 and contacting 71 to that of FIG. 3A, there is with the testing 72 an evaluation 76 of the existing connections. Thus, it is established which connections have been correctly made and which are faulty and therefore unusable. The data 66 are the result of evaluation 76. Then it is established 78 whether a correcting connecting design is possible 85 and, if this is the case 86, an optimization 70' for this correction design is carried out utilizing all the criteria mentioned above for the optimization 70. This optimization 70' must naturally be based on the data 66 of the real, actual substrate and not, as for the optimization 70 of the initialization 89, on the data of the ideal, non-contacted substrate.

The computation of the correction potential 78 and the following optimization 70' can be computed in the same step with a subsequent separation step for separating substrates that can be corrected and those that cannot.

Optimization 70' supplies data 67' of the corrected substrate plan or the correction contactings to be carried out. From this, on the one hand the optimum correction contacting process 74' is calculated together with the data 64 of the contacting device (Pt. 4) and on the other hand, together with the data 65 of the testing device, (Pt. 5) the testing process 75' is calculated. With the corresponding data 61', 62' contacting and testing are carried out. This "internal cycle" 87, as stated hereinbefore, can be repeated, if once again a contacting or wiring error has occurred and the correction potential is still not exhausted.

In another process variant with substrate return each substrate is treated as an individual at the start without presupposing a specific connection potential. For this process variant the calculation necessary would normally be considered too high, but in special cases, particularly when using a substrate eliminated from a prior process, it can be appropriate to proceed in this way, as shown in FIG. 3C.

There are two ways for establishing the correction potential. In one variant all the surfaces covered by the application are considered as forbidden zones and a new connection between peripheral contacting points is calculated. In the other variant all the conductor portions (including the faulty portions) occupied by the application are considered to be occupied and the router seeks the new connection from the residual potential of bonding possibilities. This also applies for cutting. If e.g. the defect is a shortcircuit, i.e. a cut not carried out, then there must be a further cutting location which can be opened along the "unseparated" portion. If this does not exist, this faulty connection must be declared occupied and the router must seek a new connection enabling this faulty conductor part to be excluded. Bypassing of faulty conductor parts can be obtained by a meander-like or parallel conductor path. The optimum correction layout is obtained by an iterative router algorithm, which optimizes with different priorities according to different criteria. The limiting condition is then to maintain a maximum of the connections except for the faulty connections, or to recalculate all the connections taking into account the new parameters. For maximum economic priority the first limiting condition is valid.

Initialization 89'' is simplified, compared with the previously explained variants. In place of the data 63 of the desired electrical circuit diagram, the connections of the ideal substrate are predetermined as data 63'' of the electrical circuit diagram. Thus, the calculation 70 of the optimum connection design becomes extremely simple and leads to data 67'' of the universal substrate plan. If the contacting process was calculated on the basis of data 67', then there would be a "zero contacting", i.e. no connection change would be required. The control data 61'' for the contacting necessary is directly inputted at Pt. 1. The testing process is established 75 as in the previously described variants and supplies the control data 62 for the testing device.

In the first passage through the internal cycle 87'', contacting 71 is a "zero contacting", i.e. no contacting takes place. If the testpiece is an unused, defect-free part, there is a positive result 81 following testing 72 and evaluating 76 in test 80, where it is established whether the substrate has the expected connection. However, this does not mean that the part can be allocated to the usable substrates 83, unless it was merely wished to test the unused starting substrates to ensure they were free from faults. Thus, at a branch 77, provided in addition as compared with the variant of FIG. 3B, it is checked whether it is the first passage. If this is so 78, working continues on the process branch known from FIG. 3B and there is no longer any difference in the process compared with section B—B. However, this variant is only apparently less complicated; so that initially individually the data 66 of the actual substrate is taken and in each case there is an individual calculation 70' of the optimum contacting process.

All said above obviously not only applies for the contacting process, but also for the possibly necessary conductor cutting process, which also enters the optimization. As stated, for this purpose a cutting laser or some other cutting device is used.

The optimized wiring process permits the following bonding or cutting of the conductors, which are superimposed in two planes separated by an insulating material: if the insulating material is gaseous (air), then the bonding is done by means of a laser pulse, which is dimensioned in such a way that one of the conductors sags from heating and contacts the other conductor. For this purpose the thermally formed contact can be assisted by a mechanical holding-down device. In addition, a first laser pulse can pass through the superimposed conductors and they can then be brought together again with a second, larger diameter laser pulse and welded together. The effect of the laser pulse can be assisted by a focussed laser beam, in place of a mechanical holding-down device. This gaseous beam can be heated to assist the thermal action.

In another procedure, the two superimposed conductors are perforated by a laser beam and into the latter is introduced an electrically conductive medium. A preceding pulse can be used to act on a conductor in such a way that it contacts the other conductor. The electrically conductive medium then improves the contacting action.

In another procedure spot welding can be carried out by means of a capacitor discharge via a conductor crossover. This discharge can be obtained by means of two electrodes or by means of one electrode and a conductor as an electrode.

In another procedure the conductors can be cold welded, in that one conductor is pressed with high pressure onto the other conductor. This type of welding can be assisted by using heated pressure needles or pressure needles with a sonotrode.

In another procedure there can be a connection by means of a microdispenser with which the conductors are connected by means of an electrically conductive material. In the case of the substrate according to the aforementioned European Patent the polyamide window is filled e.g. with gold or silver-containing resin, e.g. epoxy resin. The microdispenser can be constructed in much the same way as an ink jet spray head, so that it acts in the manner of a multi-welding head.

In another known procedure the conductors can be connected galvanically, in that the conductors can be exposed in a galvano bath to an antipole current, whose crossover is to be connected.

The cutting of conductors is realized by a laser pulse, which must be such that it does not heat the surrounding area and instead merely locally vaporizes a conductor portion.

Examples of laser wiring or laser-assisted wiring are given here, because lasers permit a highly planned and rapid operation. Thus, on the discussed substrate type laser pulses of 10 to 30 micrometers diameter are to be used, which is difficult with mechanical means alone. However, wiring with mechanical means is still an alternative particularly if use is made of a multi-microcontacting head, similar to a matrix printing head, permitting the simultaneous very rapid contacting of complete fields of a substrate matrix with only one positioning movement.

Figure 4:
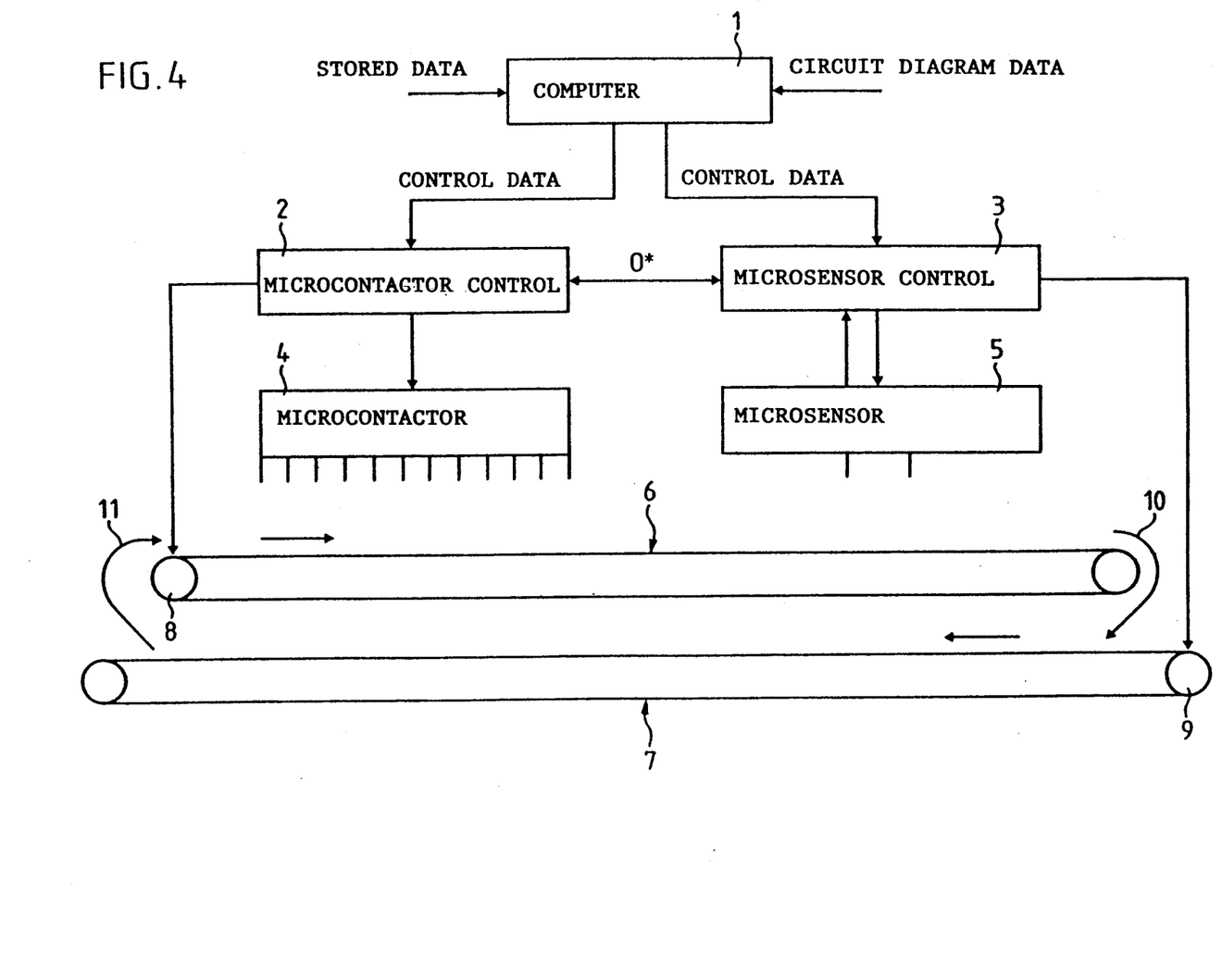
FIG. 4 is a schematic diagram of an apparatus (derived from FIG. 2) for microcontacting and micromeasurement of universal substrates.

FIG. 4 diagrammatically shows an apparatus enabling the aforementioned process to be performed. In a computer 1 containing the data for the controls and also the circuit diagram data, the wiring optimization of the universal substrate is calculated and is converted into control data for the control 2 of microcontactor 4 and the control 3 for the testing device with the microsensor 5 and on the basis of said data these two devices can be positioned over the substrate and the microcontacting head operated or the test data collected. Two transporting devices 6, 7 are controlled by control 2 of the microcontacting device and control 3 of the testing device. Drive 8 of transport device 6, which supplies the blanks to the contacting means and the program substrates to the testing means, is here controlled by the micro-contacting device control 2 and the drive 9 of transport device 7, which returns the waste substrates for correction contacting, is here controlled by the testing device control 3. The transfer of waste substrates to the return and rewiring is indicated by the two arrows 10 and 11.

The microcontacting device 4 is here in the form of a multi-microcontactor. This relates more to the mechanical device than to a laser microcontactor. However, all adequate microcontacting processes can be incorporated into the process or can be realized in the apparatus. There now follows a discussion of a mechanical multi-microcontactor with needles for deforming the contact bridges and connecting two conductors of a crossover, with which a complete array of the substrate can be simultaneously contacted. If the substrate matrixes are e.g produced in module 100, which means that an edge length has a complete multiple of 100 contacts, then a multi-microcontactor has at least one row of 100 contacting needles. Thus, up to 100 contact crossovers can be programmed with one positioning. Generally several rows of such contacting needles are combined in a multi-microcontactor, it naturally not being necessary to apply these needles with the density of the crossing points. The needle density can e.g. relate to every fifth crossing point, so that the needles are further apart. Mechanical criteria determine the density of the needle matrix. The individual needles are axially movable and individually controlled. If such a multi-microcontactor is positioned over the substrate in such a way that the needle matrix coincides with the crossing matrix, so that through the axial movement of individual needles the corresponding crossover points can be contacted, then several contacts can be created at once. Following a repositioning, the needles are activated, whose associated crossover point is to be contacted. In this way it is also possible to construct a multi-microdispenser enabling electrically conductive materials, to be introduced into the air gap between the two conductors. It is also possible to produce a multi-spot welder with integrated electrode, in which the electrodes whose associated crossover points is to be contacted are always activated. The counterelectrode is formed by the conductor.

In order to function economically, such multi-microcontactors have arrays of 100×100 contacting points, so that thousands of contacts can be formed in one positioning operation. The position is correspondingly optimized in such a way that the minimum number of positioning operations have to carried out.

Such an apparatus is an alternative to a laser microcontactor, which operates serially, but at high speed. The substrate type also makes a contribution to the decision of whether mechanical or non-mechanical (with light) contacting is used. The costs of a mechanical multi-microcontactor of the discussed size is approximately the same as for a corresponding laser installation, the programming costs also being comparable.

The operator 0*, which mediates between the contacting machine and the testing station, as stated hereinbefore, has to carry out the following functions. It links the testing results with the preset wiring information and evaluates or at least helps to evaluate the real correction potential. It executes the reoptimization and determines any residual correction potential. Thus, said operator 0* is responsible for the reoptimization of a correction of a circuit realized on a universal substrate. It works in the processing operation in such a way that in the case of a single passage of a substrate there is a virtual reoptimization, i.e. the correction potential is not used, whereas in the case of a multiple passage there is a real reoptimization and consequently the correction potential is used.

It always accompanies the movement and flanks the process with respect to malfunctions. However, it is not necessary to always determine the correction potential for each individual, faulty or non-faulty substrate. The calculation for this purpose is only initiated if there is no coincidence between the preset SPS and the tested (realized) SPS. Either the computer 1 is responsible for this process part or partial functions can be transferred to a calculator in the contacting and the testing unit.

Figure 5:
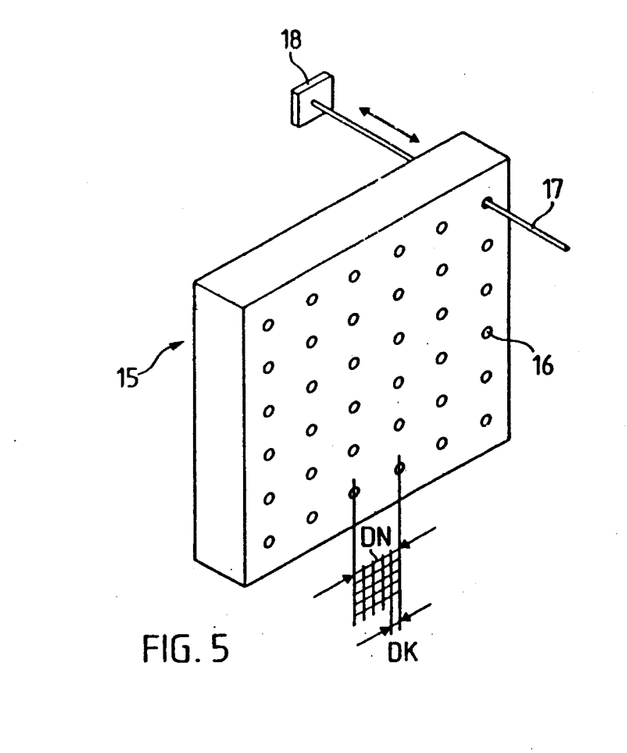
FIG. 5 is a schematic perspective view of a mechanical multi-microcontactor or a multi-microtest head illustrating the principle thereof.

FIG. 5 diagrammatically shows a multi-microcontactor with mechanical means, which can be needles or microdispensers. A guide body 15 carries a matrix-like arrangement of perforations 16 through which the contacting elements 17 are passed. These contacting elements are axially movable and are driven in controlled manner by a drive means 18, e.g. a piezo-electric element. The perforations are arranged with a spacing DN, which is an integral multiple of the crossover spacing DK of the substrate. DK represents the unit of the positioning step, in which the contacting head is positioned over the substrate. In a substrate, like that described in the aforementioned patent, the orthogonal spacing between two crossovers is, as a function of the density, 50 to 100 microns. These values are standardized and are respected with high precision during manufacture. Thus, the step length is 1/10 mm and below, which also makes high demand on the mechanical guidance of the contactor, if it is borne in mind that a substrate can have an edge length of several cm.

It is therefore recommended to provide a positioning sensor enabling corrections to take place in the positioning in such a way that positioning errors are not summated and are instead always eliminated by a regulating process.

The testing device 15 is shown as a test electrode pair. This is intended to indicate that testing can fundamentally take place with two electrodes, a multi-test electrode head naturally leading to similar advantages to a multi-microcontactor. A multi-test electrode head can in principle have the same construction to the multi-microcontactor, so that measurement can take place through positioning and placing some of the plurality of measuring electrodes at the predetermined measuring points. Once again it is recommended to use a positioning sensor, because the requirements are much the same with the test head as for the contactor, although the testing points are generally on the periphery of the substrate and in certain circumstances can be constructed in large-area form in order to reduce testing costs.

In principle, by function reversal, a multi-microcontactor can be used as a multi-microtester, because the matrix always remains the same. Such devices are then used for programming universal substrates, which in each case have the same matrix module, which is always sought.

The contacting/testing heads are e.g. fixed to a cross-slide used for carrying out the positioning. The workpieces i.e. the substrate to be programmed, are supplied on the transport device and stopped for the programming/testing process. As a function of the test result, the programmed substrate is returned and undergoes recontacting as a workpiece. The transport device is diagrammatically shown as a belt, but it can also be a robot which provides the workpiece and it can also be a controlled substrate performing the positioning steps, the contacting and/or test head being mounted with the leads. With the needles raised the positioning corresponding to a horizontal movement relative to the needle matrix is carried out and subsequently the contacting movement is performed orthogonally thereto. If this process is performed, "overhead", then as an additional safety element the weight of the needles can be used for decoupling from the substrate. Robot handling is recommended for this, in which the substrate is placed on a crosstable and the latter is rotated by 180° and pivoted downwards with the substrate over the contacting or test head and being brought into the first position with a short-stroke lowering movement.

As microcontacting can last a few minutes, the setting up time increased by robot handling is acceptable. A preparatory treatment can be introduced by using alternately loaded crosstables and this makes it possible to halve the setting-up time.

Figures 6A, 6B, 6C, 7A, 7B, 7C:
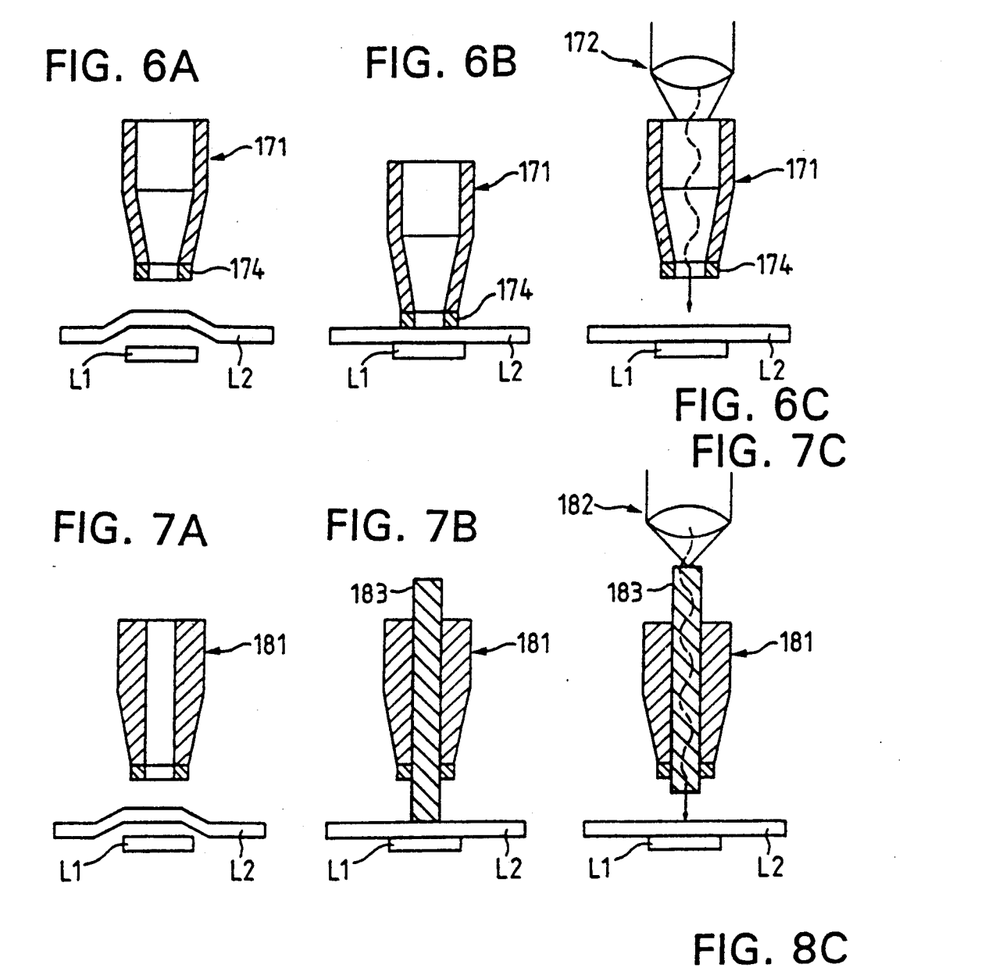
FIG. 6A, 6B, and 6C are detailed diagrams illustrating the sequence in a first contacting process.
FIG. 7A, 7B, and 7C are detailed diagrams illustrating the sequence in a second contacting process.
Figure 8A:
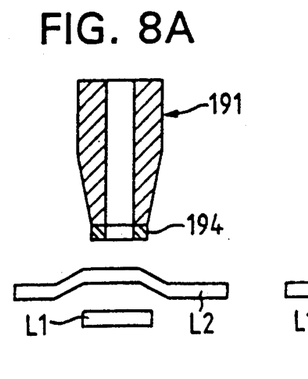
FIG. 8A, 8B, and 8C are detailed diagrams illustrating the sequence in a third contacting process.
Figures 8B, 8C:
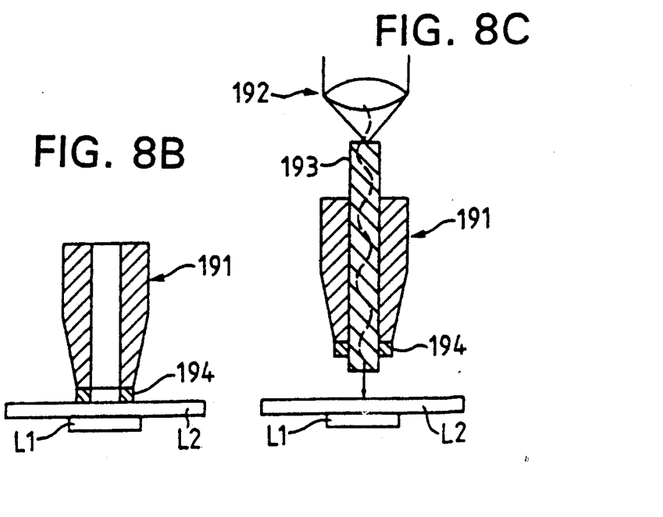

FIGS. 6, 7 and 8 provide examples of a contacting device, showing three examples of a contacting process at a contacting point. Each figure group shows three states A, B, C, which means starting position A, contacting process B and subsequent (optional) welding C.

The parts 171, 181, 191 are hollow guides, so that energy can be passed through the opening for possible subsequent welding. Laser sources 172, 182, and 192 are provided for this purpose. The laser energy is supplied either directly through the cavity or via a light guide 183, 193 to the previously mechanically contacted conductors L1 and L2. For mechanical contacting purposes, a hollow guide has a contacting ring 174, 194 designed for the limited mechanical loading.

The first stage in FIG. 6A shows the starting position. The two crossed conductors are spaced from one another by a special shaping, i.e. they are isolated by an air bridge. This isolation is removed by pressing the upper conductor L2 onto the lower conductor L1 and a galvanic connection is obtained. This pressing is shown by the second stage in FIG. 6B. In FIGS. 6A–6C and 8A-8C pressing takes place with guides 171, 191 or contact rings 174, 194 and in FIG. 8 with the light guide 183, which is passed through the guide. As only limited forces are required for deforming the conductor bridges, it is possible to use known light guide materials or light guides.

This galvanic connection fulfills the objective of creating a contact between two superimposed conductors. Welding is possible as an optional measure in a further stage C. For this purpose a correspondingly dimensioned pulse from one of laser sources 172, 182, 192 is deflected onto the intersection and the galvanic connection is reinforced by welding. A light guide may, but need not be used.

Apparatus 171-174, 181-183, and 191-194 shown in exemplified manner here can be part of a multi-contacting head. Then, in addition to the simultaneous mechanical contacting process, there will be a serial, subsequent welding process, because a random number of laser sources cannot be located in a small space. Thus, the lasers subsequently move up to the intersection and carry out welding where it is required. This need not involve all the contact points. A certain parallel arrangement of the process can be achieved by increasing the number of welding points via light guides and more than one laser source can be used. The principle of a multi-microcontacting head has already been discussed relative to FIGS. 4 and 5. This also applies with regards to the spacing of the contacting points and the way in which a substrate is moved along the head for contacting purposes. This can take place overhead, underhead or in any desired position.

We claim:

1. A process for producing an electrical circuit board from a universal substrate comprising the steps of
   providing substrate data describing a universal substrate having thereon a known pattern of conductors and predetermined bonding and cutting locations, resulting in a known quantity of connection possibilities,
   providing data describing a desired electrical circuit arrangement which is to be produced on the substrate using the existing pattern,
   calculating from the quantity of all connection possibilities of the substrate data representing the subquantity of possibilities to realize the desired circuit arrangement and the locations of connections between conductors and conductor interrruptions necessary for wiring one circuit of this subquantity,
   providing a universal substrate having conductor patterns in accordance with the substrate data,
   providing means for forming connections between conductors on the substrate and for cutting conductors on the substrate from the data of the subquantity of locations,
   providing means for testing the produced electrical circuit made from the data of the subquantity using one of the possibilities to realize the desired circuit arrangement,
   producing control data for guiding the means for forming connections and cutting conductors to the respective cutting and connecting locations,
   producing guiding control data for guiding the testing means,
   forming connections between conductors and cutting conductors on the substrate in accordance with the control data,
   testing the resulting wiring arrangement in accordance with the guiding control data and developing test data representative of the accuracy of the connection-forming and conductor-cutting steps, and
   when the test data indicate that the forming and cutting steps did not result in the desired circuit arrangement, using the test data for determining the subquantity of additional wiring possibilities available for forming a circuit arrangement in accordance with the desired circuit arrangement in subsequent processing of the substrate.

2. A process according to claim 1 and further comprising repeating the steps of forming connections between conductors and cutting conductors on the universal substrate to utilize the additional wiring possibilities.

3. A process according to claim 2 wherein, following repeating the steps of forming connections between conductors and cutting conductors on the universal substrate, testing the resulting wiring and developing test data usable for determining the quantity of additional wiring possibilities for achieving wiring in accordance with the desired circuit arrangement and making such data available for further reworking of the substrate.

4. A process according to claim 3 wherein the repeating of the steps of forming connections between conductors of the steps of forming connections between conductors and cutting conductors on the universal substrate, testing the resulting wiring and developing test data usable for determining the quantity of additional wiring possibilities for achieving wiring in accordance with the desired circuit arrangement and making such data available for further reworking of the substrate are accomplished recursively.

5. A process according to claim 1 and including controlling a multi-microcontactor as the connection forming means with the control data.

6. A process according to claim 5 including controlling the contactor so that it moves stepwise in modular spacing increments, the contacting points being spaced apart by an integral multiple of the modular spacing.

7. A process according to claim 1 wherein, when the testing indicates that the substrate connections and cuttings performed in a single operation on the substrate by the means for forming and cutting have formed a circuit which is substantially the same as the desired electrical circuit, any correction potential is not used.

8. A process according to claim 7 and including, for the step of calculating, supplying data describing the means for forming connections and, in a separate calculating process; supplying data describing the testing device and determining therefrom the testing process, and from the two calculation processes forming control data 61 for the contacting device 1 and control data for the testing device.

9. A process according to claim 1, wherein following testing of the substrate takes place wherein the substrate is measured and tested for similarity to the desired electrical circuit arrangement and wherein, if the test is failed, the existing connections on the substrate are evaluated for additional wiring possibilities.

10. A process according to claim 9 wherein the evaluation of the additional wiring possibilities takes place in two steps, including a first step in which it is established whether a correcting connection design is possible and, if so, a more complicated optimization is carried out, while incorporating all criteria for the desired circuit.

11. A process according to claim 10 wherein the reoptimization produces data for the correction of the circuit, calculating from data together with the characteristic data of the contacting device the optimum correcting contacting process and, together with the characteristic data of the testing device calculating the testing process and with the corresponding data carrying out new contacting and testing process.

12. A process according to claim 1 and including substituting, in place of the data of the desired electrical circuit arrangement, data describing the connections of a new and faultless substrate as data of the circuit diagram, and wherein in a first passage there is no connecting or cutting operation and consequently the relevant control data are determined without a calculating process and made directly available to the contacting process.

13. A process for producing an electrical circuit board from a universal substrate comprising the steps of
providing substrate data describing a universal substrate including data describing a known pattern of conductors and predetermined bonding and cutting locations thereon, resulting in a known quantity of connection possibilities,
providing data describing a desired electrical circuit arrangement which is to be produced on the substrate using the existing pattern,
calculating from the quantity of all connection possibilities of the substrate data representing the number and locations of conductor interruptions and connections between conductors necessary for arriving at the desired electrical circuit arrangement on the substrate, and selecting the connection and cutting possibilities which will best meet design criteria,
providing a universal substrate having conductor patterns in accordance with the substrate data,
providing means for forming connections between conductors on the substrate and for cutting conductors on the substrate,
from the data of the number and locations, producing control data for guiding to the respective cutting and connecting locations the means for forming connections and cutting conductors,
forming connections between conductors and cutting conductors on the substrate in accordance with the control data,
testing the resulting wiring arrangement and developing test data representative of the accuracy of the connection-forming and conductor-cutting steps,
determining from the test data whether the resulting wiring arrangement on the substrate is or is not in accordance with stored desired electrical arrangement and, if not, whether the substrate has or has not sufficient wiring possibilities remaining to accomplish alternative connections to cure defects found in the wiring arrangement, when the test data indicate that the forming and cutting steps resulted in the desired circuit arrangement, or did not result in the desired arrangement but that the substrate no longer contains sufficient wiring possibilities to accomplish alternative curative connections, terminating the process as to the processed substrate,
when the test data indicate that the forming and cutting steps did not result in the desired arrangement but that the substrate contains sufficient wiring possibilities to accomplish alternative curative connections, selecting those cutting and connection locations which best meet design criteria and producing further control data for guiding to the respective cutting and connecting locations the means for forming connections and cutting conductors, and
retesting the resulting wiring arrangement and developing test data representative of the accuracy of the connection-forming and conductor-cutting steps.

* * * * *